United States Patent [19]

Kagaya et al.

[11] Patent Number: 5,027,167
[45] Date of Patent: Jun. 25, 1991

[54] SEMICONDUCTOR INTERGRATED CIRCUIT

[75] Inventors: Osamu Kagaya; Yasunari Umemoto; Junji Shigeta, all of Kokubunji, Japan

[73] Assignee: The Agency of Industrial Science & Technology, Tokyo, Japan

[21] Appl. No.: 175,705

[22] Filed: Mar. 31, 1988

[30] Foreign Application Priority Data

Jan. 22, 1988 [JP] Japan ............................. 63-10761

[51] Int. Cl.$^5$ ................... H01L 21/76; H01L 29/72
[52] U.S. Cl. ..................................... 357/15; 357/23.2
[58] Field of Search ................................ 357/15, 23.2

[56] References Cited

U.S. PATENT DOCUMENTS

| | | | |
|---|---|---|---|
| 3,997,908 | 12/1976 | Schloetterer et al. | 357/15 |
| 4,013,483 | 3/1977 | Nuzillat et al. | 357/15 |
| 4,160,984 | 7/1979 | Ladd Jr. et al. | 357/22 |
| 4,343,082 | 8/1982 | Lepsetter et al. | 357/15 |
| 4,375,597 | 3/1983 | Kosonocky | 357/15 |
| 4,424,526 | 1/1984 | Dennard et al. | 357/14 |
| 4,468,851 | 9/1984 | Wieder et al. | 357/23.2 |
| 4,484,207 | 11/1984 | Nishizawa et al. | 357/23.2 |
| 4,486,766 | 12/1984 | Shannon | 357/15 |
| 4,499,481 | 2/1985 | Greene | 357/15 |
| 4,538,167 | 8/1985 | Yoshino et al. | 357/15 |
| 4,586,063 | 4/1986 | Nakamura et al. | 357/15 |
| 4,641,161 | 2/1987 | Kim et al. | 357/15 |
| 4,665,416 | 5/1987 | Hagio et al. | 357/15 |
| 4,839,703 | 6/1989 | Ohata et al. | 357/15 |
| 4,866,490 | 9/1989 | Itoh | 357/15 |

FOREIGN PATENT DOCUMENTS

| | | |
|---|---|---|
| 52-63680 | 5/1977 | Japan . |
| 53-80180 | 7/1978 | Japan . |
| 54-149591 | 11/1979 | Japan . |
| 0002672 | 1/1981 | Japan ............................. 357/15 G |
| 131537 | 4/1987 | Japan . |
| 0268275 | 11/1988 | Japan ............................. 357/15 |
| 63-268275 | 11/1988 | Japan ............................. 357/15 |

OTHER PUBLICATIONS

Umemoto et al., "Effects of a Buried p-Layer on Alpha-Particle Immunity of MESFET's Fabricated on Semi-Insulating GaAs Substrates", *IEEE Electron Device Letters EDL-7*, No. 6, Jun. 1986, pp. 396-97.

Umemoto et al., "Alpha Particle Soft-Error Immunity of MESFET's with Buried p-Layer (I and II)" Abstracts 29p-X-11 and -12, presented at the Spring 1987 Meeting of the Japan Society of Applied Physics and Related Societies.

*Primary Examiner*—Andrew J. James
*Assistant Examiner*—Viet Q. Nguyen
*Attorney, Agent, or Firm*—Pennie & Edmonds

[57] ABSTRACT

The semiconductor integrated circuit of the present invention includes an electrode to which potential is supplied to apply an electric field to an isolation layer between similar semiconductor layers having ohmic electrodes and implanted into a compound semiconductor substrate. By this construction this invention reduces the development of temporary conduction in the isolation layer due to disturbance of potential barrier by α particles, and can improve pronouncedly the tolerance to α particle induced soft errors.

9 Claims, 2 Drawing Sheets

SEMICONDUCTOR INTERGRATED CIRCUIT

FIELD OF THE INVENTION

The present invention relates to semiconductor integrated circuits, and particularly to the method of isolation in the compound semiconductor integrated circuits.

DESCRIPTION OF PRIOR ART

A method of suppressing temporary conduction caused by α particles in the isolation layer of compound semiconductor integrated circuit as represented by GaAs IC is discussed in Vol. 3, p. 842 (29p-x-12), of Preprint for the 34th Applied Physics Conference.

The prior art referred to above uses a p-type conductive semiconductor layer for arresting a temporary conduction phenomenon caused in the isolation layer when irradiated with α particles. The following is a description of the prior art. The isolation layer is illustrated in FIG. 2; n+ layers (3) and (3') which are high-concentration n-type impurity layers are formed on a semi-insulating substrate (5), and a p-type impurity layer (4) is provided between said n+ layers (3) and (3'). Part (2) is an ohmic electrode.

In case there is no p-type impurity layer (4), the potential barrier against electrons present between n+ layers (3) and (3') is as low as 0.68 eV. Accordingly, this potential barrier can easily be destroyed by the incidence of α particles, causing a temporary conductive status. In the prior art, a p-type impurity layer (4) is provided at a place deeper than n+ layers (3) and (3') to elevate the potential barrier to 1.28 eV for the purpose of preventing the development of said temporary conductive status due to α-particle incidence.

Usually, the p-type impurity layer (4) is formed to remain depleted (preferred density of impurities: $1 \times 10^{16}$ to $4 \times 10^{16} cm^{-3}$), and no ohmic electrode is provided for the p-type impurity layer (4). This is because should the p-type impurity layer (4) become conductive, p-n junction capacitance would develop in the n+ (or n) layers (3) and (3') to impair the response speed of the integrated circuit.

Accordingly, it is not possible to increase the potential barrier by applying a voltage to the p-type impurity layer (4). On the other hand, the increase of the potential barrier by the introduction of the p-type impurity layer (4) is not more than 0.63 eV. In case the isolation width between n+ layers (3) and (3') is less than 3 μm, the potential barrier is not enough to prevent the development of temporary conductive status due to α particle incidence.

In an SRAM (static random access memory) using this kind of isolation method, the temporary breakdown of isolation due to α particle incidence allows a current to flow to destroy data in the memory cell (this is termed a "soft error" due to particles).

The purpose of the present invention is to provide an integrated circuit isolation method with high tolerance to α particles.

SUMMARY OF THE INVENTION

The purpose of the present invention referred to above can be achieved by providing an electrode that can apply an electric field to an isolation layer between n-type (or p-type) semiconductor layers having ohmic electrodes and implanted into a compound semiconductor substrate.

By applying a voltage to the electrode provided on the isolation layer between n+ layers, the potential barrier can be raised high enough to countervail the barrier destructive effect of α particles.

For example, when o particles impinge upon a GaAs substrate, electron-hole pairs are created. If the Kinetic energy of the α particle is 4 MeV, the charge amount of electrons and holes is 160 fC. These electrons and holes disturb the isolation layer potential variously through diffusion or drift, causing the potential barrier to be destroyed temporarily.

By providing an electrode on the isolation layer and applying a voltage to it, the potential barrier can be elevated. In case a Schottky electrode is provided, for example, the surface potential, $\psi_s$, of the isolation layer is given by the following equation.

$$\psi_s = \phi_B - V_{apply}$$

where $\phi_B$ is the Schottky barrier height between metal and semiconductor, and $V_{apply}$ is the voltage applied to the Schottky electrode which usually is set in the range of 0.6 V to −5 V. The effect of this surface potential runs deep into the semiconductor to raise the potential barrier. By increasing $V_{apply}$ in the negative direction to elevate $\psi_s$, the potential barrier of the isolation layer can be raised high enough to check the development of temporary conductive status due to α particle incidence and thus prevent soft errors in the integrated circuit.

DETAILED DESCRIPTION OF PREFERRED EMBODIMENT

Preferred embodiment (1)

Figure 1:
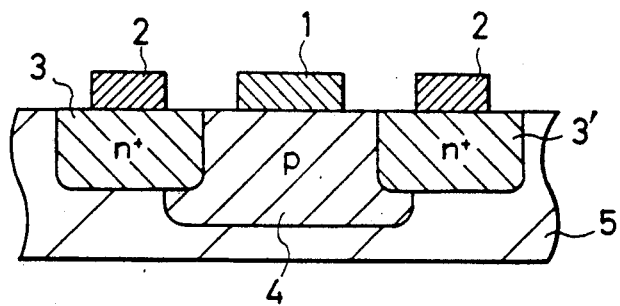
FIG. 1 shows a cross-sectional view of the isolation structure employed in the preferred embodiment (1) of the present invention.
Figure 2:
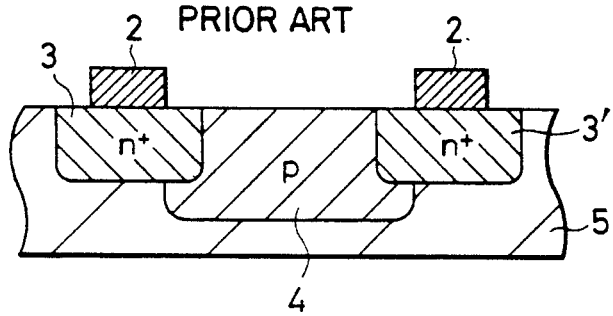
FIG. 2 illustrates a cross-sectional view of the conventional isolation structure.
Figure 3:
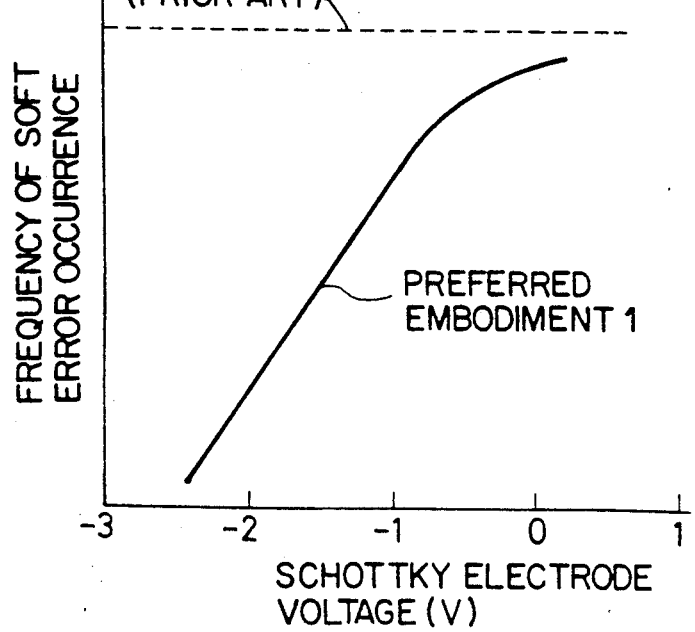
FIG. 3 is a graph showing the soft error reduction effect of the preferred embodiment (1) of the present invention.

The following describes the present invention with reference to its preferred embodiment (1) illustrated in FIGS. 1 and 3.

FIG. 1 is a cross-sectional view of an isolation layer of an integrated circuit, and FIG. 3 is a graph showing the effect of reduction of soft error. By ion implantation into semi-insulating GaAs substrate (5) followed by an annealing process, p-type impurity layer (4) and high-concentration n-type impurity layers (n+ layers, (3) and (3')) are formed. The p-type impurity layer (4) is formed by implanting Mg ions to a dose of $1.2 \times 10^{12} cm^{-2}$ under an acceleration voltage of 400 keV. On the other hand, n+ layers (3) and (3') are formed by implanting Si ions to a dose of $3 \times 10^{13} cm^{-2}$ at an acceleration voltage of 100 keV. The annealing process usually is carried out at 800° C. for 15 minutes.

Then, Schottky electrode (1) is deposited by sputtering and dressed by reactive dry etching. The Schottky electrode (1) is made of WSi having a high melting point. Following this, the ohmic electrodes (2) are formed according to the ordinary liftoff process. The Schottky electrode (1) and p-type impurity layer (4) form a Schottky junction. When the voltage applied to Schottky electrode (1) is lowered, the potential barrier against electrons between n+ layers (3) and (3') can be elevated. Therefore, according to this preferred embodiment, temporary conduction between n+ layers (3) and (3') due to incidence of α particles can be precluded.

FIG. 3 shows the soft error reduction effect of this preferred embodiment applied to an SRAM. Referring to FIG. 3, the vertical axis represents the frequency of SRAM soft error due to α particles, and the horizontal axis is graduated with the voltage applied to Schottky electrode (1). As shown by the solid line, the effect of suppressing the soft error rate is made greater the lower the Schottky electrode voltage becomes. As compared with the conventional SRAM indicated by a dash line in the figure, the α-particle induced soft rate error of the SRAM according to the present invention can be reduced dramatically.

The preferred embodiment (1) also offers another benefit that the leakage of the surface current between n+ layers (3) and (3') can be reduced to a minimum to bring about a substantial increase in isolation break down voltage and relaxation of back gate effect.

As regards the preferred embodiment (1), the p-type impurity layer (4) may be formed using an acceleration energy level in the range of 10 keV to 400 keV and an ion implantation dose higher than $10^{11} cm^{-2}$. In addition, ion seeds can be Be, C and Zn in addition to Mg.

The n+ layers (3) and (3') may be formed using an acceleration energy level in the range of 50 keV to 200 keV and an ion implantation dose of $1 \times 10^{12}$ to $5 \times 10^{13} cm^{-2}$, and the ion seeds may be Se, S, $SiF^4$ in addition to Si. The n+ layers (3) and (3') can be transformed into an n-type active layer depending on the element layout.

In such a case, the implantation energy level and implantation dose can be selected within the range of 20 keV to 200 keV and $1 \times 10^{11} cm^{-2}$ to $1 \times 10^{13} cm^{-2}$, respectively.

W, MoSi, TiW, WN and $LaB_6$ in addition to WSi are available as a material for Schottky electrode (1). Schottky electrode (1) may be formed using the ordinary liftoff process. In this case, Ti, Cr, Al and Pt may also be used as an electrode material.

Preferred embodiment (2)

Figure 4:
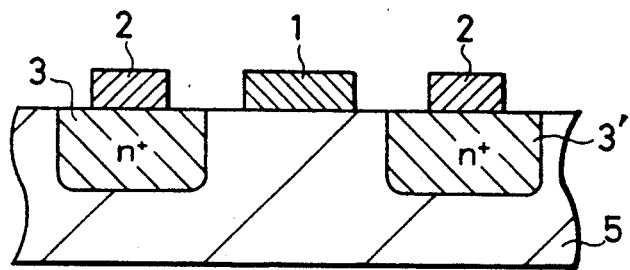
FIGS. 4 through 6 show the cross-sectional views of the isolation structures employed in the preferred embodiments (2) through (4) of the present invention.

The following describes the present invention with reference to another preferred embodiment (2) illustrated in FIG. 4. Unlike the preferred embodiment (1), the preferred embodiment (2) is devoid of p-type impurity layer (4), and the semi-insulating substrate (5) serves as an isolation layer.

Although in this embodiment of the invention, the resistance to α particle-induced soft errors are reduced somewhat due to the absence of the potential barrier otherwise provided by the p-type impurity layer (4), such reduction can be recouped by increasing the negative voltage applied to metal electrode (1).

According to the preferred embodiment (2), the process for forming the p-type impurity layer (4) can be eliminated to improve the economy and efficiency of shortening of integrated circuit production.

Preferred embodiment (3)

Figure 5:
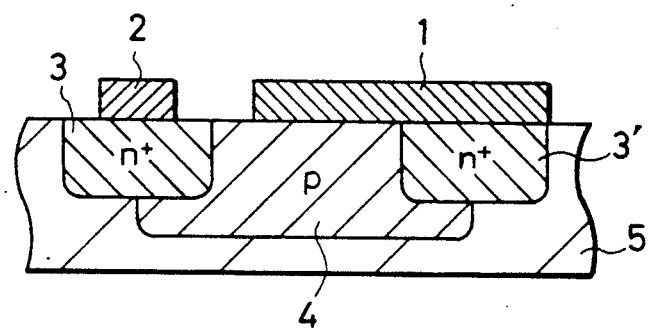

Still another embodiment (3) of the present invention is illustrated in FIG. 5. It differs from preferred embodiment (1) in that one of two ohmic electrodes (2) is omitted and instead Schottky electrode (1) is extended over n+ layer (3'). According to this preferred embodiment, the wiring design of integrated circuit can be simplified, and the integration density can be increased.

Preferred embodiment (4)

Figure 6:
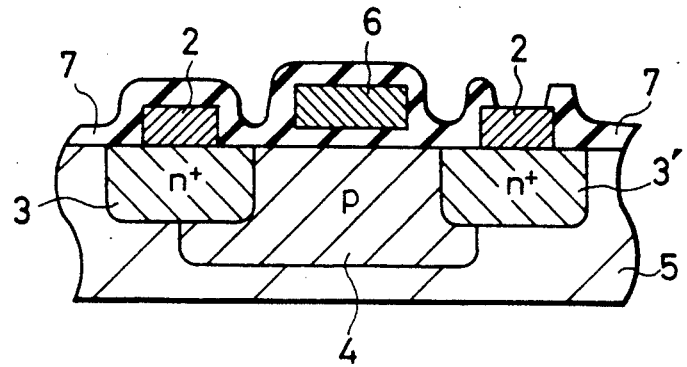

The following describes still another preferred embodiment (4) of the present invention while referring to FIG. 6. The difference from the preferred embodiment (1) is that Schottky electrode (1) is omitted and instead an electrode (6) is formed in an $SiO_2$ film (7) and thereby forms a metal insulator semiconductor junction with the isolation layer (4).

According to this preferred embodiment (4), the application of an electric field to the p-type impurity layer (4) is not accompanied by leakage current to n+ layers (3) and (3'), making it possible to reduce the current between the electrode (6) and p-type impurity layer (4).

As detailed above, the present invention checks the development of temporary conduction in the isolation layer due to disturbance of potential barrier by α particles, and can improve pronouncedly the tolerance to α particle induced soft errors as compared with the conventional integrated circuit isolation method.

What is claimed is:

1. A semiconductor integrated circuit featuring a compound semiconductor substrate, a pair of compound semiconductor layers of the same type of semiconductor material located side by side and spaced from one another on the surface of said compound semiconductor substrate, said pair of compound semiconductor layers being electrically isolated from one another by an isolation layer provided between said compound semiconductor layers, at least one ohmic electrode electrically connected to one of said compound semiconductor layers, and an electrode provided on and electrically connected to said isolation layer to apply an electric field to said isolation layer.

2. A semiconductor integrated circuit according to claim 1 in which said compound semiconductor layers are high-concentration n-type conductive compound semiconductor layers, said isolation layer is a p-type conductive compound semiconductor layer, and said electrode electrically connected to said isolation layer is a Schottky electrode.

3. A semiconductor integrated circuit according to claim 2 in which said Schottky electrode forms a Schottky junction with one of said high-concentration n-type conductive compound semiconductor layers.

4. A semiconductor integrated circuit according to claim 1 in which said isolation layer is part of the semi-insulating substrate.

5. A semiconductor integrated circuit according to claim 1 in which said compound semiconductor layers are high-concentration n-type conductive compound semiconductor layers, said isolation layer is a p-type conductive compound semiconductor layer, and said electrode electrically connected to said isolation layer forms a metal insulator semiconductor junction with said isolation layer.

6. A semiconductor integrated circuit, comprising:
a compound semiconductor substrate;

first and second semiconductor layers of the same type of semiconductor material disposed on said substrate;

at least one ohmic electrode, electrically connected to one of said first and second semiconductor layers;

an isolation layer disposed on said substrate and between said first and second semiconductor layers, said isolation layer electrically isolating said first and second semiconductor layers from one another; and an electrode disposed on said isolation layer for applying an electric field to said isolation layer while maintaining said first and second semiconductor layers completely electrically isolated from each other.

7. A semiconductor integrated circuit according to claim 6, wherein:

said first and second semiconductor layers are high-concentration N-type conductive compound semiconductor layers;

said isolation layer is a p-type conductive compound semiconductor; and an ohmic electrode is electrically connected only to said first semiconductor layer;

said electrode disposed on said isolation layer is a Schottky electrode and forms a Schottky junction with said second semiconductor layer.

8. A semiconductor integrated circuit according to claim 6, wherein:

said first and second semiconductor layers are high concentration N-type conductive compound semiconductor layers;

said isolation layer is a p-type conductive semiconductor layer; and said electrode disposed on said isolation layer is surrounded by an $SiO_2$ film and forms a metal insulator semiconductor junction with said isolation layer.

9. A semiconductor integrated circuit, comprising:

a compound semiconductor substrate;

two semiconductor layers of the same type of semiconductor material disposed on said substrate with said substrate interposed between said two layers thereby forming an electrical isolation barrier between said two layers; and two ohmic electrodes, one each electrically connected to one of said two layers;

an electrode disposed on said substrate interposed between said two layers for applying an electric field to said substrate while maintaining said two layers electrically isolated from each other.

* * * * *